United States Patent
Pfau

(10) Patent No.: US 9,166,628 B2
(45) Date of Patent: Oct. 20, 2015

(54) USE OF PARITY-CHECK CODING FOR CARRIER-PHASE ESTIMATION IN AN OPTICAL TRANSPORT SYSTEM

(71) Applicant: Alcatel-Lucent USA Inc., Murray Hill, NJ (US)

(72) Inventor: Timo J. Pfau, Westfield, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 33 days.

(21) Appl. No.: 14/105,854

(22) Filed: Dec. 13, 2013

(65) Prior Publication Data

US 2015/0171895 A1   Jun. 18, 2015

(51) Int. Cl.
| | |
|---|---|
| *H03M 13/00* | (2006.01) |
| *H04L 1/00* | (2006.01) |
| *G06F 11/10* | (2006.01) |
| *H04B 10/60* | (2013.01) |

(Continued)

(52) U.S. Cl.
CPC ............... *H03M 13/63* (2013.01); *G06F 11/10* (2013.01); *H03M 13/6325* (2013.01); *H03M 13/6337* (2013.01); *H04B 10/60* (2013.01); *H04L 1/0045* (2013.01); *H04L 25/03178* (2013.01); *H04L 27/34* (2013.01)

(58) Field of Classification Search
CPC .............. H03M 13/63; H03M 13/6337; H04L 25/03178
See application file for complete search history.

(56) References Cited

U.S. PATENT DOCUMENTS

| | | | | | |
|---|---|---|---|---|---|
| 5,202,643 | A | * | 4/1993 | Sato .............................. | 329/309 |
| 5,426,539 | A | * | 6/1995 | Llewellyn et al. .............. | 360/51 |
| 5,457,705 | A | * | 10/1995 | Todoroki ....................... | 714/795 |

(Continued)

FOREIGN PATENT DOCUMENTS

| | | |
|---|---|---|
| WO | 2010107439 A1 | 9/2010 |
| WO | WO2013098369 A1 | 7/2013 |

OTHER PUBLICATIONS

"Next-Generation Optical Communication Systems," 2011, www.stratresearch.se [retrieved on Apr. 17, 2012]. Retrieved from the Internet: <URL: http://www.stratresearch.se/PageFiles/2441/6f%20Peter%20Andrekson%20Chalmers.pdf> (24 pages).

(Continued)

*Primary Examiner* — Joseph D Torres
(74) *Attorney, Agent, or Firm* — Mendelsohn, Drucker & Dunleavy, P.C.; Yuri Gruzdkov

(57) ABSTRACT

An optical transport system is configured to use a modulation scheme in which a phase rotation applied to a sequence of PSK or QAM constellation symbols encoding a codeword of an FEC code produces a modified sequence of PSK or QAM constellation symbols encoding a bit-word that is not a valid codeword of that FEC code. Based on this property of the modulation scheme, an optical receiver may be configured to relatively accurately recover the absolute phase of the optical carrier wave of the received modulated optical signal by applying maximum likelihood sequence estimation processing to each portion of the signal carrying a valid codeword of the FEC code. For example, for a modulation scheme employing a $2^n$-PSK constellation, the optical receiver may be able to recover the absolute phase of the optical carrier wave with an accuracy that is better than $360/2^n$ degrees.

17 Claims, 4 Drawing Sheets

(51) Int. Cl.
*H04L 27/34* (2006.01)
*H04L 25/03* (2006.01)

(56) References Cited

U.S. PATENT DOCUMENTS

| | | | | |
|---|---|---|---|---|
| 5,701,333 | A * | 12/1997 | Okanoue et al. | 375/347 |
| 5,724,394 | A * | 3/1998 | Ikeda et al. | 375/341 |
| 6,181,729 | B1 * | 1/2001 | O'Farrell | 375/130 |
| 6,222,891 | B1 * | 4/2001 | Liu et al. | 375/326 |
| 6,744,814 | B1 * | 6/2004 | Blanksby et al. | 375/232 |
| 7,046,935 | B1 | 5/2006 | Fang et al. | |
| 7,145,968 | B2 | 12/2006 | Kuo et al. | |
| 7,286,762 | B2 | 10/2007 | Elahmadi et al. | |
| 7,474,860 | B2 | 1/2009 | Essiambre et al. | |
| 7,974,357 | B2 | 7/2011 | Maret et al. | |
| 2001/0017898 | A1 * | 8/2001 | Raheli et al. | 375/262 |
| 2002/0063934 | A1 | 5/2002 | Sakauchi | |
| 2003/0063353 | A1 | 4/2003 | Hamoir | |
| 2005/0226638 | A1 | 10/2005 | Nesset et al. | |
| 2005/0265495 | A1 * | 12/2005 | Yui | 375/346 |
| 2006/0176977 | A1 * | 8/2006 | Jafarkhani et al. | 375/298 |
| 2006/0210002 | A1 * | 9/2006 | Yang et al. | 375/350 |
| 2008/0199191 | A1 | 8/2008 | Essiambre et al. | |
| 2009/0147648 | A1 | 6/2009 | Vlutters | |
| 2009/0175367 | A1 * | 7/2009 | Kishigami et al. | 375/260 |
| 2010/0061737 | A1 | 3/2010 | Kato | |
| 2010/0158521 | A1 | 6/2010 | Doerr et al. | |
| 2010/0247107 | A1 | 9/2010 | Sadot et al. | |
| 2011/0038631 | A1 | 2/2011 | Doerr | |
| 2011/0150147 | A1 | 6/2011 | Yang et al. | |
| 2012/0033682 | A1 | 2/2012 | Corral | |
| 2012/0096327 | A1 | 4/2012 | Cai | |
| 2012/0148255 | A1 | 6/2012 | Liu et al. | |
| 2012/0148264 | A1 | 6/2012 | Liu et al. | |
| 2013/0128942 | A1 * | 5/2013 | Sikri et al. | 375/229 |
| 2013/0209089 | A1 | 8/2013 | Harley et al. | |
| 2013/0230312 | A1 | 9/2013 | Randel et al. | |
| 2013/0343750 | A1 | 12/2013 | Lanzone et al. | |
| 2015/0003554 | A1 * | 1/2015 | Kato et al. | 375/267 |

OTHER PUBLICATIONS

Karlsson, Magnus, et al., "Which is the Most Power-Efficient Modulation Format in Optical Links?" Optics Express, 2009, vol. 17, No. 13, pp. 10814-10819.

Johannisson, Pontus, et al., "A Modified Constant Modulus Algorithm for Polarization-Switched QPSK," Optics Express, vol. 19, No. 8, 2011, pp. 7734-7741.

Liu, Xiang, et al., "Demonstration of 2.7-PPB Receiver Sensitivity Using PDM-QPSK with 4-PPM and Unrepeatered Transmission over a Single 370-km Unamplified Ultra-Large-Area Fiber Span," European Conference and Exposition on Optical Communications (ECOC) Geneva, Switzerland, Sep. 18, 2011 (6 pages).

Serena, P., et al., "The Performance of Polarization Switched-QPSK (PS-QPSK) in Dispersion Managed WDM Transmissions," 36th European Conference and Exhibition on Optical Communication (ECOC), 2010, Torino Italy, pp. 1-3.

Chatzidiamantis, Nestor D., et al., "EM-Based Maximum-Likelihood Sequence Detection for MIMO Optical Wireless Systems," ICC'09 Proceedings of the 2009 IEEE International Conference on Communications, pp. 2583-2587.

Alfiad, Mohammad S., et al., "Maximum-Likelihood Sequence Estimation for Optical Phase-Shift Keyed Modulation Formats," Journal of Lightwave Technology, 2009, vol. 27, No. 20, pp. 4583-4594.

Millar, David S., et al., "Blind Adaptive Equalization of Polarization-Switched QPSK Modulation," Optics Express, 2011, vol. 19, No. 9, pp. 8533-8538.

Poggiolini, P., et al., "Performance Evaluation of Coherent WDM PS-QPSK (HEXA) Accounting for Non-Linear Fiber Propagation Effects," Optics Express, 2010, vol. 18, No. 11, pp. 11360-11371.

Su, Karen., "Efficient Maximum Likelihood Detection for Communication over Multiple Input Multiple Output Channels," Technical Report, University of Cambridge, Cambridge, UK, Feb. 2005, <http://www.cl.cam.ac.uk/research/dtg/publications/public/ks349/Su05B.pdf> (44 pages).

Krongold, Brian S., et al., "Blind Equalization for Polarization-Switched QPSK Optical Communications," U.S. Appl. No. 13/335,326, filed on Dec. 22, 2011.

Neda Rezaei Malek, "Optimization of the Viterbi and Viterbi Carrier Phase Error Detection Algorithm," www.wcl.ece.upatras.gr, [retrieved on Dec. 3, 2013]. Retrieved from the Internet: <URL: http://www.wcl.ece.upatras.gr/CSNDSP/contents/Sessions/Presentations/A9%20-%20Coding%20I/A9.2.pdf> (4 pages).

Timo J. Pfau et al., "Forward Error Correction for an Optical Transport System," U.S. Appl. No. 13/537,131, filed on Jun. 29, 2012.

International Search Report; Mailed Mar. 18, 2015 for the corresponding PCT Application No. PCT/US2014/066505.

* cited by examiner

FIG. 2

TABLE 1: CODEWORDS OF THE RATE-1/2 FEC CODE

|    | $b_k$ | $b_{k+1}$ | $b_{k+2}$ | $b_{k+3}$ | $c_k$ | $c_{k+1}$ | $c_{k+2}$ | $c_{k+3}$ |
|----|-------|-----------|-----------|-----------|-------|-----------|-----------|-----------|
| 1  | 0 | 0 | 0 | 0 | 0 | 0 | 0 | 0 |
| 2  | 0 | 0 | 0 | 1 | 0 | 1 | 0 | 1 |
| 3  | 0 | 0 | 1 | 0 | 0 | 1 | 1 | 0 |
| 4  | 0 | 0 | 1 | 1 | 0 | 0 | 1 | 1 |
| 5  | 0 | 1 | 0 | 0 | 1 | 0 | 0 | 1 |
| 6  | 0 | 1 | 0 | 1 | 1 | 1 | 0 | 0 |
| 7  | 0 | 1 | 1 | 0 | 1 | 1 | 1 | 1 |
| 8  | 0 | 1 | 1 | 1 | 1 | 0 | 1 | 0 |
| 9  | 1 | 0 | 0 | 0 | 1 | 0 | 1 | 0 |
| 10 | 1 | 0 | 0 | 1 | 1 | 1 | 1 | 1 |
| 11 | 1 | 0 | 1 | 0 | 1 | 1 | 0 | 0 |
| 12 | 1 | 0 | 1 | 1 | 1 | 0 | 0 | 1 |
| 13 | 1 | 1 | 0 | 0 | 0 | 0 | 1 | 1 |
| 14 | 1 | 1 | 0 | 1 | 0 | 1 | 1 | 0 |
| 15 | 1 | 1 | 1 | 0 | 0 | 1 | 0 | 1 |
| 16 | 1 | 1 | 1 | 1 | 0 | 0 | 0 | 0 |

400

USE OF PARITY-CHECK CODING FOR CARRIER-PHASE ESTIMATION IN AN OPTICAL TRANSPORT SYSTEM

BACKGROUND

1. Field

The present disclosure relates to optical communication equipment and, more specifically but not exclusively, to the use of forward-error-correction techniques for carrier-phase estimation in optical transport systems.

2. Description of the Related Art

This section introduces aspects that may help facilitate a better understanding of the invention(s). Accordingly, the statements of this section are to be read in this light and are not to be understood as admissions about what is in the prior art or what is not in the prior art.

Advanced modulation formats, such as quadrature phase shift keying (QPSK) and quadrature amplitude modulation (QAM), enable data to be modulated in both the phase and the amplitude of the optical carrier wave. However, a known drawback of these modulation formats is a relatively complex receiver structure, where the relative phase between the optical local-oscillator (OLO) signal and the carrier wave of the received modulated optical signal needs to be tracked continuously for the modulated data to be recovered. The tracking can be done, e.g., using a phase-lock loop (PLL) circuit, which is a negative-feedback control system configured to lock the OLO signal to the phase and frequency of the carrier wave of the received modulated optical signal. However, PLL circuits may add significantly to the cost and complexity of the corresponding coherent optical receiver. An alternative to a PLL circuit is the use of intradyne detection, where the phase tracking is implemented in the electrical-digital domain via digital signal processing after optical-to-electrical conversion, sampling, and analog-to-digital conversion. However, efficient synchronization and phase-estimation algorithms for intradyne detection are still undergoing research and development.

SUMMARY OF SOME SPECIFIC EMBODIMENTS

Disclosed herein are various embodiments of an optical transport system configured to use a modulation scheme in which a phase rotation applied to a sequence of phase-shift keying (PSK) or quadrature amplitude modulation (QAM) constellation symbols encoding a codeword of a forward-error-correction (FEC) code produces a modified sequence of PSK or QAM constellation symbols encoding a bit-word that is not a valid codeword of that FEC code. Based on this property of the modulation scheme, an optical receiver may be configured to relatively accurately recover the absolute phase of the optical carrier wave of the received modulated optical signal (e.g., resolve a 90-degree phase ambiguity) by applying maximum likelihood sequence estimation (MLSE) processing to each portion of the signal carrying a valid codeword of the FEC code. For example, for a modulation scheme employing a $2^n$-PSK constellation (where n is a positive integer), the optical receiver may be able to recover the absolute phase of the optical carrier wave with an accuracy that is better than $360/2^n$ degrees without the use of pilot symbols or a PLL circuit.

According to one embodiment, provided is an apparatus comprising an optical receiver that comprises: a front-end circuit configured to convert a portion of a modulated optical signal corresponding to a first codeword of an FEC code into a first set of digital values; and a digital circuit configured to apply MLSE processing to the first set of digital values to recover the first codeword. The digital circuit comprises a plurality of parallel processing branches, each configured to: receive a copy of the first set of digital values; apply a respective phase rotation to said copy to generate a respective string of values; and generate, based on the respective string of values, a respective measure of a phase of an optical carrier wave of the modulated optical signal. The digital circuit is configured to recover the first codeword based on the plurality of said measures of the phase generated by said plurality of parallel processing branches.

According to another embodiment, provided is a method of estimating a phase of an optical carrier wave of a modulated optical signal comprising the steps of: (A) converting a portion of the modulated optical signal corresponding to a first codeword of an FEC code into a first set of digital values; and (B) applying MLSE processing to the first set of digital values to estimate the phase of the optical carrier wave of the modulated optical signal. The step of applying comprises the sub-steps of: (B1) applying a different respective phase rotation to each of a plurality of copies of the first set of digital values to generate a plurality of strings of values; (B2) generating a plurality of measures of the phase of the optical carrier wave based on the plurality of the strings of values and a plurality of codewords of the FEC code; (B3) selecting, based on a selection criterion, one of the plurality of the measures of the phase; and (B4) selecting a phase of the phase rotation corresponding to the selected one of the plurality of the measures of the phase as an estimate of the phase of the optical carrier wave.

BRIEF DESCRIPTION OF THE DRAWINGS

Other aspects, features, and benefits of various embodiments of the invention will become more fully apparent, by way of example, from the following detailed description and the accompanying drawings, in which:

FIG. 2 shows example codewords that can be used to implement FEC encoding and decoding in the optical transport system of FIG. 1 according to an embodiment of the disclosure;

FIG. 3A graphically shows four transmitted QPSK symbols corresponding to codeword 8 of FIG. 2;

FIG. 3B graphically shows four detected QPSK symbols corresponding to codeword 8 of FIG. 2 in case of a phase mismatch of 90 degrees;

FIG. 3C graphically shows four detected QPSK symbols corresponding to codeword 8 of FIG. 2 in case of a phase mismatch of 180 degrees;

FIG. 3D graphically shows four detected QPSK symbols corresponding to codeword 8 of FIG. 2 in case of a phase mismatch of 270 degrees.

DETAILED DESCRIPTION

The subject matter of this application is partially related to that of U.S. patent application Ser. No. 13/537,131, filed Jun.

29, 2012, and entitled "FORWARD ERROR CORRECTION FOR AN OPTICAL TRANSPORT SYSTEM," which application is incorporated herein by reference in its entirety.

Figure 1:
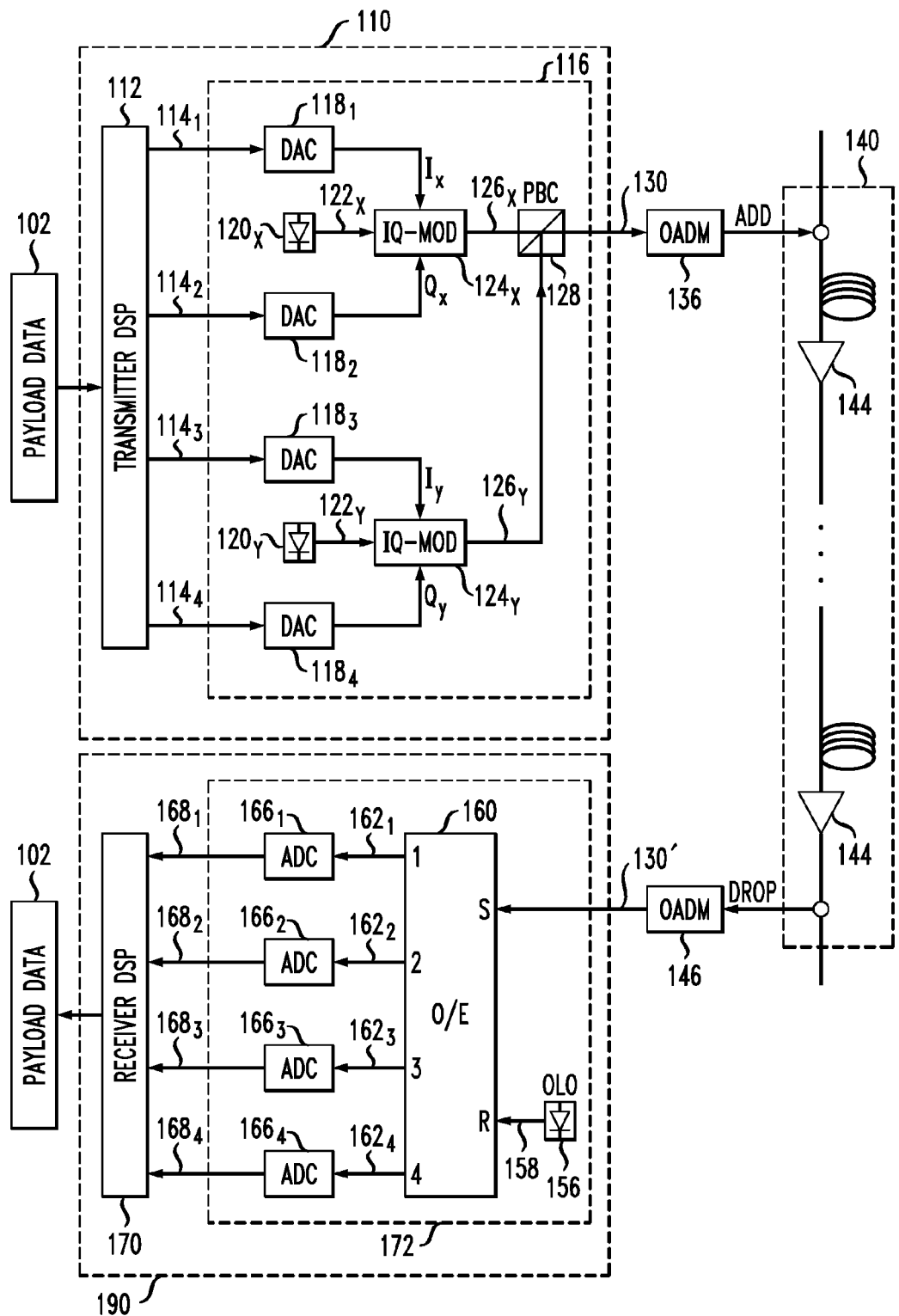
FIG. 1 shows a block diagram of an optical transport system in which various embodiments of the disclosure can be practiced.

FIG. 1 shows a block diagram of an optical transport system 100 in which various embodiments of the disclosure can be practiced. System 100 has an optical transmitter 110 that is configured to (i) modulate light using constellation symbols and (ii) apply a resulting optical output signal 130 to an optical transport link 140. System 100 also has an optical receiver 190 that is configured to appropriately process a corresponding optical input signal 130' received via optical transport link 140 from transmitter 110 to recover the corresponding original data. Note that optical transport link 140 transforms signal 130 into signal 130' by imposing various signal distortions including, inter alia, additive white Gaussian noise (AWGN), phase noise, and various forms of non-linear noise. Both transmitter 110 and receiver 190 rely on the same selected constellation in the processes of generating signal 130 and decoding signal 130', respectively.

Transmitter 110 receives a digital (electrical) input stream 102 of payload data and applies it to a digital signal processor (DSP) 112. DSP 112 processes input stream 102 to generate digital signals $114_1$-$114_4$. Such processing may include forward-error-correction (FEC) encoding, which adds redundancy to the transmitted data, e.g., as further described below in reference to FIG. 2. In each signaling interval (also referred to as a time slot corresponding to an optical symbol or a symbol period), signals $114_1$ and $114_2$ carry digital values that represent the in-phase (I) component and quadrature (Q) component, respectively, of a corresponding constellation point intended for transmission using X-polarized light. Signals $114_3$ and $114_4$ similarly carry digital values that represent the I and Q components, respectively, of the corresponding constellation point intended for transmission using Y-polarized light, where the Y-polarization is orthogonal to the X-polarization.

An electrical-to-optical (E/O) converter (also sometimes referred to as a front-end circuit) 116 of transmitter 110 transforms digital signals $114_1$-$114_4$ into modulated optical output signal 130. More specifically, digital-to-analog converters (DACs) $118_1$ and $118_2$ transform digital signals $114_1$ and $114_2$ into an analog form to generate drive signals $I_X$ and $Q_X$, respectively. Drive signals $I_X$ and $Q_X$ are then used, in a conventional manner, to drive an I-Q modulator $124_X$. Based on drive signals $I_X$ and $Q_X$, I-Q modulator $124_X$ modulates an X-polarized beam $122_X$ of light supplied by a laser source $120_X$, thereby generating a modulated optical signal $126_X$.

DACs $118_3$ and $118_4$ similarly transform digital signals $114_3$ and $114_4$ into an analog form to generate drive signals $I_Y$ and $Q_Y$, respectively. Based on drive signals $I_Y$ and $Q_Y$, an I-Q modulator $124_Y$ modulates a Y-polarized beam $122_Y$ of light supplied by a laser source $120_Y$, thereby generating a modulated optical signal $126_Y$.

In an alternative embodiment, laser sources $120_X$ and $120_Y$ can be replaced by a single laser source coupled to an optical splitter so that (i) an output port of the optical splitter that outputs X-polarized light is configured to provide X-polarized beam $122_X$ and (ii) an output port of the optical splitter that outputs Y-polarized light is configured to provide Y-polarized beam $122_Y$.

A polarization beam combiner 128 combines modulated optical signals $126_X$ and $126_Y$ to generate optical output signal 130.

Optical output signal 130 can be applied to an optional optical add-drop multiplexer (OADM) 136 configured to add this signal, as known in the art, to other optical signals that are being transported via optical transport link 140.

Link 140 is illustratively shown as being an amplified link having a plurality of optical amplifiers 144 configured to amplify the optical signals that are being transported through the link, e.g., to counteract signal attenuation. Note that an optical link that has only one or even no optical amplifiers can alternatively be used as well. After propagating the intended length of link 140, optical signal 130 becomes optical signal 130', which is dropped from the link via another optional optical add-drop multiplexer, OADM 146, and directed to receiver 190 for processing.

Receiver 190 has a front-end circuit 172 comprising an optical-to-electrical (O/E) converter 160, four analog-to-digital converters (ADCs) $166_1$-$166_4$, and an optical local oscillator (OLO) 156. O/E converter 160 has (i) two input ports labeled S and R and (ii) four output ports labeled 1 through 4. Input port S receives optical signal 130'. Input port R receives an optical reference signal 158 generated by OLO 156. Reference signal 158 has an optical-carrier frequency (wavelength) that is sufficiently close to that of signal 130' to enable intradyne detection of the latter signal. Reference signal 158 can be generated, e.g., using a relatively stable tunable laser whose output wavelength is sufficiently close to the carrier wavelength of signal 130'.

O/E converter 160 operates to mix input signal 130' and reference signal 158 to generate eight mixed optical signals (not explicitly shown in FIG. 1). O/E converter 160 then converts the eight mixed optical signals into four electrical signals $162_1$-$162_4$ that are indicative of complex values corresponding to the two orthogonal-polarization components of signal 130'. For example, electrical signals $162_1$ and $162_2$ may be an analog in-phase signal and an analog quadrature signal, respectively, corresponding to the X-polarization component of signal 130'. Electrical signals $162_3$ and $162_4$ may similarly be an analog in-phase signal and an analog quadrature signal, respectively, corresponding to the Y-polarization component of signal 130'.

In one embodiment, O/E converter 160 is a polarization-diverse 90-degree optical hybrid (PDOH) with four balanced photo-detectors coupled to its eight output ports. Various suitable PDOHs are commercially available, e.g., from Optoplex Corporation of Fremont, Calif., and CeLight, Inc., of Silver Spring, Md. Additional information on various O/E converters that can be used to implement O/E converter 160 in various embodiments of system 100 are disclosed, e.g., in U.S. Patent Application Publication Nos. 2010/0158521 and 2011/0038631, and International Patent Application No. PCT/US09/37746 (filed on Mar. 20, 2009), all of which are incorporated herein by reference in their entirety.

Each of electrical signals $162_1$-$162_4$ generated by O/E converter 160 is converted into digital form in a corresponding one of ADCs $166_1$-$166_4$. Optionally, each of electrical signals $162_1$-$162_4$ may be amplified in a corresponding amplifier (not explicitly shown) prior to the resulting signal being converted into digital form. Digital signals $168_1$-$168_4$ produced by ADCs $166_1$-$166_4$ are then appropriately processed by a digital signal processor (DSP) 170 to recover the data of the original input stream 102 applied to transmitter 110.

DSP 170 is configured to decode digital signals $168_1$-$168_4$ to recover original payload data 102. In particular, DSP 170 is configured to perform FEC-decoding processing using frame-based maximum likelihood sequence estimation (MLSE) applied to a set of values derived from digital-signal samples provided by digital signals $168_1$-$168_4$ and corresponding to an FEC-encoded data frame. In addition, DSP 170 may be configured to perform various channel-equalization and/or distortion-correction procedures.

FIG. 2 shows example codewords (where i=1, 2, . . . , 16) that can be used to implement FEC encoding and decoding in optical transport system 100 (FIG. 1) according to an embodiment of the disclosure. The codewords shown in FIG. 2 correspond to a rate-½ FEC code defined by Eqs. (1a)-(1d):

$$c_k = b_k \oplus b_{k+1} \quad (1a)$$

$$c_{k+1} = b_{k+2} \oplus b_{k+3} \quad (1b)$$

$$c_{k+2} = b_k \oplus b_{k+2} \quad (1c)$$

$$c_{k+3} = b_{k+1} \oplus b_{k+3} \quad (1d)$$

where k is the time-slot index; $b_k$-$b_{k+3}$ are information bits; $c_k$-$c_{k+3}$ are parity bits; and the "$\oplus$" sign denotes an XOR operation. Each codeword $W_i$ is a binary string that has the following structure: ($b_k$, $b_{k+1}$, $b_{k+2}$, $b_{k+3}$, $c_k$, $c_{k+1}$, $c_{k+2}$, $c_{k+3}$).

In one embodiment, system 100 can be configured to transport each of the codewords shown in FIG. 2 using four respective QPSK symbols $q_k$-$q_{k+3}$ generated in accordance with Eqs. (2a)-(2d):

$$q_k = b'_k + jb'_{k+1} \quad (2a)$$

$$q_{k+1} = b'_{k+2} + jb'_{k+3} \quad (2b)$$

$$q_{k+2} = c'_k + jc'_{k+1} \quad (2c)$$

$$q_{k+3} = c'_{k+2} + jc'_{k+3} \quad (2d)$$

where $b'_k$-$b'_{k+3}$ and $c'_k$-$c'_{k+3}$ are analog values generated from information bits $b_k$-$b_{k+3}$ and parity bits $c_k$-$c_{k+3}$, respectively, as follows: (i) if the bit value is digital one, then the corresponding analog value is +1, and (ii) if the bit value is digital zero, then the corresponding analog value is −1. As the time indices imply, system 100 is configured to transport the four QPSK symbols $q_k$-$q_{k+3}$ carrying a codeword of the above-described rate-½ FEC code over four consecutive time slots and using the same (e.g., X or Y) polarization. Hence, the two orthogonal polarizations can be used to transport in parallel two different codewords during each time period spanning four consecutive time slots.

Figure 3A:
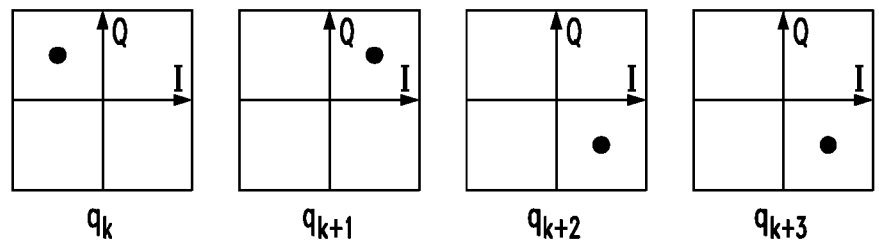
FIGS. 3A-3D, taken together, graphically illustrate the rotational asymmetry of an example modulation scheme that can be used in the optical transport system of FIG. 1 according to an embodiment of the disclosure.
Figure 3B:
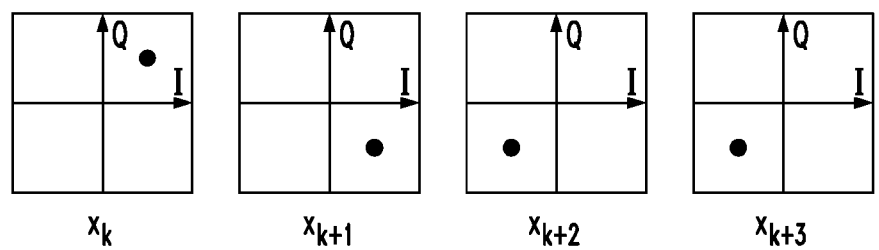
Figure 3C:
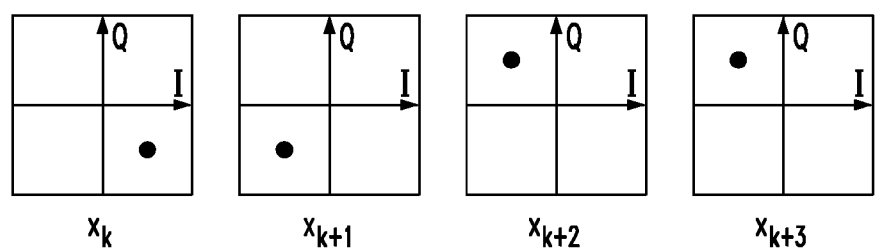
Figure 3D:
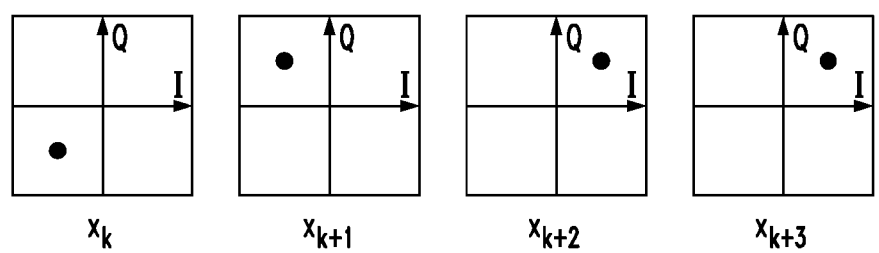

FIGS. 3A-3D graphically illustrate the rotational asymmetry of the optical modulation scheme defined by Eqs. (1)-(2). More specifically, FIG. 3A shows four QPSK symbols $q_k$-$q_{k+3}$ generated by transmitter 110 to transmit codeword 8 (see Table 1, in FIG. 2). Each of FIGS. 3B-3D shows an example of the four QPSK symbols $x_k$-$x_{k+3}$ that may be detected by receiver 190 as a result of said transmission due to the phase rotation, e.g., caused by the phase noise in link 140 and/or the OLO phase drift at the receiver.

FIG. 3B represents a phase mismatch of 90 degrees between transmitted QPSK symbols $q_k$-$q_{k+3}$ and detected QPSK symbols $x_k$-$x_{k+3}$. This phase mismatch causes each of QPSK symbols $q_k$-$q_{k+3}$ to appear in FIG. 3B as being rotated about the origin of the IQ plane by 90 degrees in the clockwise direction. If decoded as detected, the QPSK symbols $x_k$-$x_{k+3}$ of FIG. 3B would be interpreted by receiver 190 as the following bit-word: $X_1$=(11100000). Inspection of Table 1 (FIG. 2) reveals however that bit-word $X_1$ is not a valid codeword of the rate-½ FEC code used at transmitter 110.

FIG. 3C represents a phase mismatch of 180 degrees between transmitted QPSK symbols $q_k$-$q_{k+3}$ and detected QPSK symbols $x_k$-$x_{k+3}$. This phase mismatch causes each of QPSK symbols $q_k$-$q_{k+3}$ to appear in FIG. 3C as being rotated about the origin of the IQ plane by 180 degrees. If decoded as detected, the QPSK symbols $x_k$-$x_{k+3}$ of FIG. 3C would be interpreted by receiver 190 as the following bit-word: $X_2$= (10000101). Inspection of Table 1 (FIG. 2) reveals however that bit-word $X_2$ is not a valid codeword of the rate-½ FEC code used at transmitter 110.

FIG. 3D represents a phase mismatch of 270 degrees between transmitted QPSK symbols $q_k$-$q_{k+3}$ and detected QPSK symbols $x_k$-$x_{k+3}$. This phase mismatch causes each of QPSK symbols $q_k$-$q_{k+3}$ to appear in FIG. 3D as being rotated about the origin of the IQ plane by 270 degrees in the clockwise direction. If decoded as detected, the QPSK symbols $x_k$-$x_{k+3}$ of FIG. 3D would be interpreted by receiver 190 as the following bit-word: $X_3$=(00011111). Inspection of Table 1 (FIG. 2) reveals however that bit-word $X_3$ is not a valid codeword of the rate-½ FEC code used at transmitter 110.

The fact that none of bit-words $X_1$-$X_3$ is a valid codeword of the rate-½ FEC code used at transmitter 110 is a manifestation of the above-mentioned rotational asymmetry of the optical modulation scheme defined by Eqs. (1)-(2). One of ordinary skill in the art will be able to easily verify that, in fact, each of codewords 1-7 and 9-16 (see Table 1, FIG. 2) is characterized by a rotational asymmetry that is qualitatively similar to the rotational asymmetry of codeword 8 illustrated by FIGS. 3A-3D. Note that the sixteen codewords shown in Table 1 (FIG. 2) are rotationally asymmetric despite the fact that the underlying two-dimensional constellation, i.e., the QPSK constellation, is rotationally symmetric with respect to rotations about the origin of the IQ plane by 90, 180, and 270 degrees. In some embodiments, the above-indicated rotational asymmetries of the codewords may advantageously be used to determine the absolute-phase value of the phase mismatch between the carrier wave of optical input signal 130' and optical reference signal 158, e.g., as further described below in reference to FIG. 4. The determined absolute-phase value can then be used to properly decode optical input signal 130' and recover the data of stream 102. In contrast, conventional (e.g., blind) carrier-recovery algorithms do not operate to resolve the above-indicated four-fold phase ambiguity, which may disadvantageously force the use of differential encoding.

As used herein, the term "absolute phase" refers to a phase value from the range between 0 and 360 degrees that unambiguously identifies the phase of the corresponding signal, e.g., with respect to the phase of a reference wave. One of ordinary skill in the art will appreciate that, in most applications, any unambiguous phase value can be converted into a corresponding absolute-phase value, e.g., by subtracting from or adding to that phase value an integer multiple of 360 degrees. The absolute-phase value can then be used in the relevant signal processing instead of the original unambiguous phase value without changing the outcome of said processing.

Figure 4:
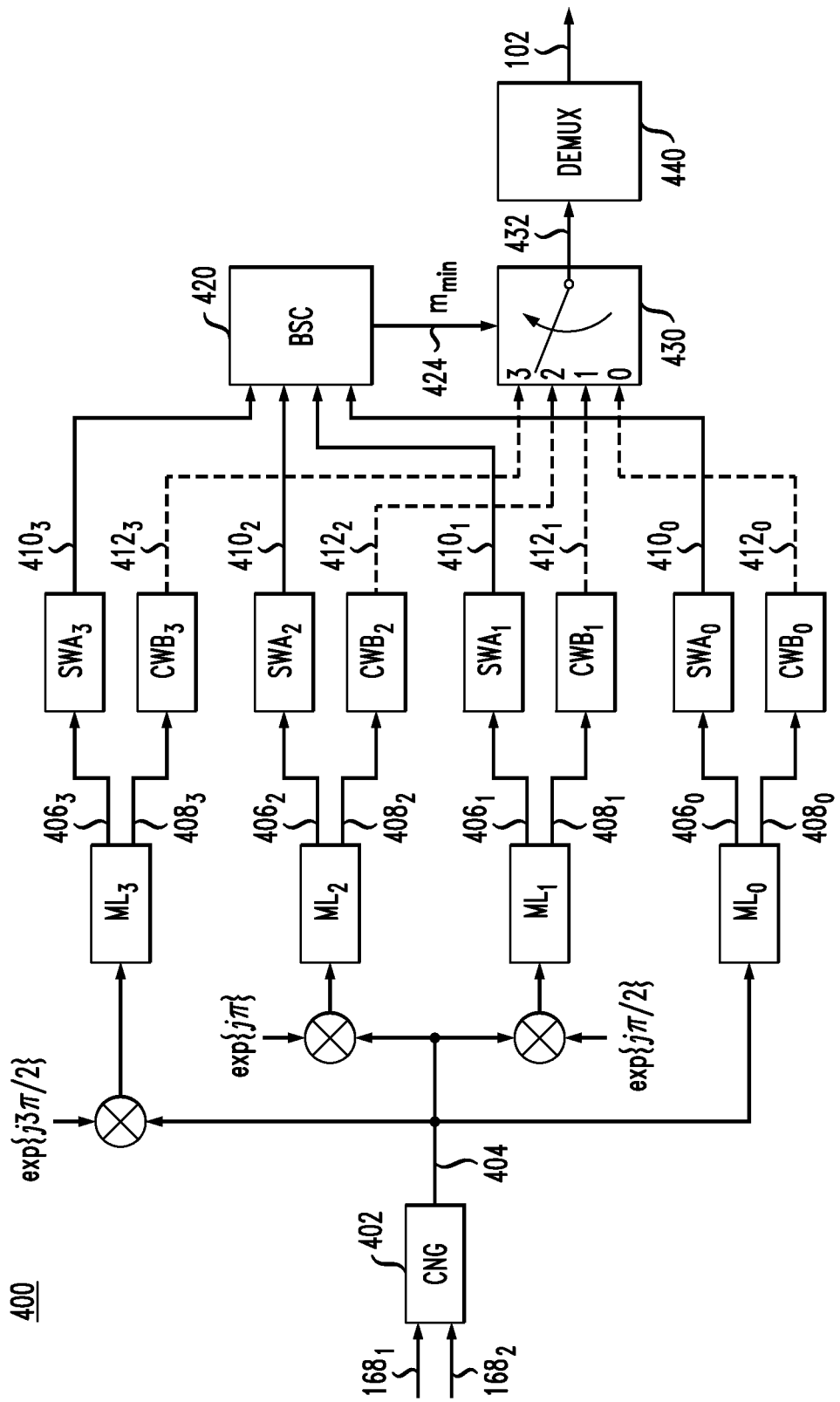
FIG. 4 shows a block diagram of a digital circuit that can be used in the optical transport system of FIG. 1 according to an embodiment of the disclosure.

FIG. 4 shows a block diagram of a digital circuit 400 that can be used in DSP 170 (FIG. 1) according to an embodiment of the disclosure. Circuit 400 is illustratively shown as being configured to receive digital signals 168$_1$ and 168$_2$. Alternatively, circuit 400 can be configured to receive digital signals 168$_3$ and 168$_4$. In some embodiments, DSP 170 may have two instances (copies) of circuit 400, one configured to receive digital signals 168$_1$ and 168$_2$, and the other configured to receive digital signals 168$_3$ and 168$_4$.

In some embodiments, DSP 170 (FIG. 1) may be configured to apply additional signal processing to digital signals 168$_1$-168$_4$ prior to applying these signals to circuit(s) 400. Such additional signal processing may include, but is not limited to signal processing corresponding to various channel-equalization and distortion-correction techniques, e.g., as described in commonly owned U.S. Patent Application Publication Nos. 2012/0148255 and 2012/0148264, both of which are incorporated herein by reference in their entirety. For example, the additional signal processing may include timing recovery, frame synchronization, electronic polarization rotation, electronic dispersion compensation, electronic frequency estimation, electronic compensation of the frequency offset (if any) between OLO signal 158 and the carrier frequency of optical input signal 130', electronic channel estimation, and electronic channel equalization.

In some embodiments, some preliminary phase-recovery processing may be applied to digital signals $168_1$-$168_4$ prior to applying these signals to circuit(s) 400. For example, for the QPSK constellation, a Viterbi and Viterbi algorithm may be applied to implement the preliminary phase recovery (e.g., as outlined in the article by Neda Rezaei Malek entitled "Optimization of the Viterbi and Viterbi Carrier Phase Error Detection Algorithm," which is incorporated herein by reference in its entirety). However, as known in the art, a conventional Viterbi and Viterbi algorithm may only be capable of recovering the phase modulo $\pi/2$ (90 degrees). Thus, to convert the phase value generated by the Viterbi and Viterbi algorithm into the corresponding absolute-phase value, some sort of phase unwrapping needs to be performed. However, conventional phase-unwrapping algorithms are known to be inherently unstable and prone to causing catastrophic errors in the signal-processing chain if the data are not differentially encoded. Alternatively, pilot symbols may be used to help the receiver acquire and maintain an absolute-phase reference. However, pilot symbols disadvantageously introduce an additional overhead.

Various embodiments of circuit 400 address at least some of the above-indicated problems and can be used to recover the absolute phase without the use of pilot symbols or a PLL circuit.

In the embodiment shown in FIG. 4, digital signals $168_1$ and $168_2$ received by circuit 400 are applied to a complex-number generator (CNG) 402 configured to convert these signals into a corresponding complex-valued digital signal 404. Four copies of complex-valued digital signal 404 are then applied to four processing branches of circuit 400. One of the processing branches (shown at the bottom of FIG. 4) is configured to process the received copy of signal 404 without changes. Each of the other three processing branches multiplies the received copy of signal 404 by a respective complex exponential factor prior to processing, e.g., using a respective multiplier as indicated in FIG. 4. The complex exponential factors applied by the multipliers in these three processing branches are $\exp(j\pi/2)$, $\exp(j\pi)$, and $\exp(j3\pi/2)$, respectively.

Each of the four processing branches in circuit 400 comprises a respective maximum-likelihood detector $ML_m$, a respective sliding-window adder $SWA_m$, and a respective codeword buffer $CWB_m$, where m=0, 1, 2, 3.

In some embodiments, sliding-window adders $SWA_m$ can be replaced by a block-based adder. This replacement may reduce the hardware complexity because the output generated by the block-based adder can be used in all processing branches. However, the use of sliding-window adders $SWA_m$ may result in better performance characteristics compared to those achievable with the use of a block-based adder.

Detector $ML_m$ is configured to apply frame-based MLSE (maximum likelihood sequence estimation) processing to each frame consisting of four complex values received by detector $ML_m$ in four consecutive time slots corresponding to a respective transmitted codeword. In an example embodiment, detector $ML_m$ is configured to carry out the following processing steps:

(1) Using the four complex values received during the four time slots of a frame, form a respective string of values $V_k=(v_{1,k}, v_{2,k}, v_{3,k}, v_{4,k}, v_{5,k}, v_{6,k}, v_{7,k}, v_{8,k})$, where $v_{1,k}$ and $v_{2,k}$ are the real part and the imaginary part, respectively, of the complex value received by detector $ML_m$ in the k-th time slot; $v_{3,k}$ and $v_{4,k}$ are the real part and the imaginary part, respectively, of the complex value received by detector $ML_m$ in the (k+1)-th time slot; $v_{5,k}$ and $v_{6,k}$ are the real part and the imaginary part, respectively, of the complex value received by detector $ML_m$ in the (k+2)-th time slot; and $v_{7,k}$ and $v_{8,k}$ are the real part and the imaginary part, respectively, of the complex value received by detector $ML_m$ in the (k+3)-th time slot;

(2) Calculate a set of sixteen squared distances $D^2_{k,i}$, where i=1, 2, . . . , 16, each being a squared distance in the corresponding eight-dimensional space between string $V_k$ and codeword $W_i$ of the rate-½ FEC code used at transmitter 110. Recall that the sixteen codewords $W_i$ of the rate-½ FEC code are shown in Table 1 (FIG. 2). In one embodiment, the squared distances $D^2_{k,i}$ are squared Euclidean distances. In some alternative embodiments, other types of distances may also be used;

(3) Find a smallest squared distance, $D^2_{k,i0}$, within the calculated set of sixteen squared distances $D^2_{k,i}$, where $i_0$ is the value of the index i corresponding to the found smallest squared distance;

(4) Among codewords $W_i$, identify codeword $W_{i0}$ corresponding to the found smallest squared distance as a candidate codeword; and (5) Output the found smallest squared distance, $D^2_{k,i0}$ and the corresponding codeword $W_{i0}$ for further use in circuit 400. Hence, every four time slots corresponding to a transmitted codeword, each of detectors $ML_m$ (where m=0, 1, 2, 3) outputs a respective squared distance $(D^2_{k,i0})_m$ and the codeword $(W_{i0})_m$ corresponding to that squared distance $(D^2_{k,i0})_m$. The two output signals generated by detector $ML_m$, which are labeled $406_m$ and $408_m$ in FIG. 4, provide to the downstream circuits the squared distance $(D^2_{k,i0})_m$ and the codeword $(W_{i0})_m$, respectively.

Adder $SWA_m$ is configured to generate a sum $S_m$ of 2L+1 squared distances $(D^2_{k,i0})_m$ received via signal $406_m$ from detector $ML_m$, where L is a positive integer that defines the width of the sliding window used in the adder. More specifically, each sum $S_m$ generated by $SWA_m$ includes (i) the L previous squared distances $(D^2_{k,i0})_m$, i.e., the squared distances corresponding to the L frames that precede the current frame; (ii) the current squared distance $(D^2_{k,i0})_m$, i.e., the squared distance corresponding to the current frame; and (iii) the L subsequent squared distances $(D^2_{k,i0})_m$, i.e., the squared distances corresponding to the L frames that follow the current frame. Thus, the sliding window of adder $SWA_m$ is centered on the current frame, has a width of 2L+1 frames, and advances forward by one frame every four time slots. The fact that each sum $S_m$ includes the squared distances corresponding to the L frames that follow the current frame introduces a processing delay of at least 4L time slots.

In one embodiment, adder $SWA_m$ includes a FIFO (first in, first out) buffer (not explicitly shown in FIG. 4) having a capacity for holding the 2L+1 squared distances $(D^2_{k,i0})_m$ used for generating the corresponding sum $S_m$. The content of the FIFO buffer is updated every four time slots, e.g., by removing therefrom the oldest squared distance $(D^2_{k,i0})_m$ stored therein, and adding thereto the newest squared distance $(D^2_{k,i0})_m$ received via signal $406_m$ from detector $ML_m$. The corresponding sum $S_m$ is then generated every four time slots by simply summing the 2L+1 values currently held in the FIFO buffer of adder $SWA_m$. The resulting value of sum $S_m$ is provided, via an output signal $410_m$, to a branch-selector controller (BSC) 420.

In one embodiment, buffer $CWB_m$ includes a delay line and an output register (not explicitly shown in FIG. 4). The delay line is configured to delay, by 4L time slots, the stream of codewords generated by detector $ML_m$ and received by buffer $CWB_m$ via signal $408_m$ to cause the output register in the buffer to contain the codeword $(W_{i0})_m$ corresponding to the center frame of the sliding window used in adder $SWA_m$. The content of the output register is refreshed every four time slots. The current value stored in the output register is provided, via an output signal $412_m$, to a branch selector 430.

Branch-selector controller 420 is configured to determine which one of the four processing branches in circuit 400 most accurately cancels the present phase mismatch between the carrier wave of optical input signal 130' and optical reference signal 158. Branch-selector controller 420 makes this determination by (i) comparing the sums $S_0$, $S_1$, $S_2$, and $S_3$ received via signals $410_m$ from adders $SWA_m$ (where m=0, 1, 2, 3) and (ii) identifying the smallest among these four sums. Branch-selector controller 420 then provides the value ($m_{min}$) of the index m corresponding to the smallest of the sums $S_0$, $S_1$, $S_2$, and $S_3$ to branch selector 430, e.g., using a control signal 424 as indicated in FIG. 4. For example, if $S_0$ is the smallest sum among $S_0$, $S_1$, $S_2$, and $S_3$, then $m_{min}$=0. If $S_1$ is the smallest sum among $S_0$, $S_1$, $S_2$, and $S_3$, then $m_{min}$=1, etc. One of ordinary skill in the art will understand that the value of $m_{min}$ provided by branch-selector controller 420 to branch selector 430 may change over time, e.g., due to phase noise and/or the OLO phase drift.

In one embodiment, the value of $m_{min}$ generated by branch-selector controller 420 in the above-described manner may also be used to obtain an estimate of the present phase mismatch between the carrier wave of optical input signal 130' and optical reference signal 158. More specifically, if $m_{min}$=0, then the present phase mismatch is approximately zero degrees. If $m_{min}$=1, then the present phase mismatch is approximately 90 degrees. If $m_{min}$=2, then the present phase mismatch is approximately 180 degrees. If $m_{min}$=3, then the present phase mismatch is approximately 270 degrees. Note that the phase-mismatch estimate obtained based on the value of $m_{min}$ is the same as the argument of the complex exponential factor applied in the corresponding processing branch of circuit 400 to the received copy of digital signal 404.

Branch selector 430 has four input ports, labeled 0 through 3. Input ports 0-3 are configured to receive output signals $412_0$-$412_3$, respectively, from buffers $CWB_0$-$CWB_3$. Based on the value of $m_{min}$ received via control signal 424 from branch-selector controller 420, branch selector 430 selects the corresponding one of signals $412_0$-$412_3$ and passes it on to the output port of the branch selector as an output signal 432. For example, when $m_{min}$=0, branch selector 430 selects signal $412_0$ and passes it on as output signal 432. When $m_{min}$=1, branch selector 430 selects signal $412_1$ and passes it on as output signal 432. When $m_{min}$=2, branch selector 430 selects signal $412_2$ and passes it on as output signal 432. When $m_{min}$=3, branch selector 430 selects signal $412_3$ and passes it on as output signal 432. Recall that each of signals $412_m$ (where m=0, 1, 2, 3) carries a respective codeword $(W_{i0})_m$ generated by detector $ML_m$, e.g., as described above. Thus, output signal 432 generated by branch selector 430 provides a sequence of codewords $W_i$ (see Table 1, FIG. 2) that represent the receiver's best guess at the bit sequence representing the QPSK symbols generated by optical transmitter 110 (FIG. 1) in accordance with Eqs. (1)-(2).

A de-multiplexer (DMUX) 440 operates to transform signal 432 into output data stream 102 (also see FIG. 1). In one embodiment, this transformation can be done, e.g., by (i) removing the parity bits ($c_k$, $c_{k+1}$, $c_{k+2}$, $c_{k+3}$) from each of the codewords in signal 432 and (ii) concatenating the remaining information bits ($b_k$, $b_{k+1}$, $b_{k+2}$, $b_{k+3}$) of the different codewords into a continuous bit stream to form output data stream 102.

One of ordinary skill in the art will realize that circuit 400 lends itself to relatively straightforward generalization for a modulation scheme that is based on any $2^n$-PSK constellation, where n is a positive integer. Note that the above-considered example of the QPSK constellation corresponds to n=2. Some of the modifications that can be made to adapt system 100 (FIG. 1) and circuit 400 (FIG. 4) to a modulation scheme that is based on a $2^n$-PSK constellation are outlined below.

A $2^n$-PSK constellation encodes n bits per constellation point and is characterized by $2^n$ unique phases in the IQ plane. A rotationally asymmetric codeword needs to have a length of at least 2n bits to be able to accommodate the required $2^n$ different complex exponential factors (corresponding to the phase rotations analogous to those shown in FIGS. 3A-3D) in a manner that causes only $2^n$ bit-words out of all possible (e.g., at least $2^{2n}$) bit-words to be valid codewords of the employed FEC code. This means that the rate of the employed FEC code may need to be ½ or lower. It may also be advantageous for the codewords to have a length that is an integer multiple of n. The latter property enables the length of the codewords to exactly match the bit capacity of a corresponding integer-multiple number of constellation symbols of the $2^n$-PSK constellation, thereby preventing any unwarranted loss of bandwidth, but may also impose additional limitations on the rate of the employed FEC code.

In one embodiment, to handle the signal processing corresponding to a modulation scheme that is based on a $2^n$-PSK constellation, circuit 400 is modified to have $2^n$ (instead of four) parallel processing branches. Each of said $2^n$ processing branches includes a respective maximum-likelihood detector $ML_m$, a respective sliding-window adder $SWA_m$, and a respective codeword buffer $CWB_m$, where m=0, 1, 2, . . . , $2^n$−1. The processing branches corresponding to m=1, 2, . . . , $2^n$−1 also include respective multipliers, each configured to multiply the received copy of signal 404 by a respective complex exponential factor of $\exp(jm\pi/2^n)$. The processing branch corresponding to m=0 may not need such a multiplier because, for m=0, $\exp(jm\pi/2^n)$=1. Branch-selector controller 420 is modified to have $2^n$ (instead of four) input ports to be able to determine which one of the $2^n$ processing branches in modified circuit 400 most-accurately cancels the present phase mismatch between the carrier wave of optical input signal 130' and optical reference signal 158. Branch selector 430 is modified to have $2^n$ (instead of four) input ports to receive output signals $412_0$-$412_m$, respectively, from buffers $CWB_0$-$CWB_m$, where m=0, 1, 2, . . . , $2^n$−1. Accordingly, the value of $m_{min}$ may range from 0 to $2^n$−1. As a result, the granularity of the phase-mismatch determination in the modified circuit 400 is approximately $360/2^n$ degrees.

One of ordinary skill in the art will further realize that circuit 400 also lends itself to relatively straightforward modification for a modulation scheme that is based on a QAM constellation. The number of branches in a modified circuit 400 depends on the rotational symmetry of the QAM constellation. For example, the use of a 1-5-5-5 star-QAM constellation (which has one constellation point at the origin of the IQ plane, and five PSK constellation points on each of the three different-amplitude rings) can be enabled by a modified circuit 400 having five processing branches, each configured with a different respective multiplier. As another example, the use of a square 16-QAM constellation can be enabled by a modified circuit 400 having four processing branches.

According to an example embodiment disclosed above in reference to FIGS. 1-4, provided is an apparatus comprising an optical receiver (e.g., 190, FIG. 1) that comprises: a front-end circuit (e.g., 172, FIG. 1) configured to convert a modulated optical signal (e.g., 130', FIG. 1) corresponding to a first codeword (e.g., any of the codewords shown in Table 1, FIG. 2) of an FEC code into a first set of digital values (e.g., carried by digital signals 168$_1$ and 168$_2$, FIGS. 1 and 4); and a digital circuit (e.g., 170, FIG. 1; 400, FIG. 4) configured to apply MLSE processing to the first set of digital values to recover the first codeword. The digital circuit comprises a plurality of parallel processing branches, each configured to: receive a copy of the first set of digital values; apply a respective phase rotation to said copy to generate a respective string of values (e.g., $V_k = (v_{1,k}, v_{2,k}, v_{3,k}, v_{4,k}, v_{5,k}, v_{6,k}, v_{7,k}, v_{8,k})$); and generate, based on the respective string of values, a respective measure (e.g., sum $S_m$ of $2L+1$ squared distances $(D^2_{k,i0})_m$) of a phase of an optical carrier wave of the modulated optical signal. The digital circuit is configured to recover the first codeword based on the plurality of said measures of the phase generated by said plurality of parallel processing branches.

In some embodiments of the above apparatus, the modulated optical signal is modulated using a QAM constellation.

In some embodiments of any of the above apparatus, the modulated optical signal is modulated using a $2^n$-PSK constellation, where n is a positive integer; and the plurality of parallel processing branches includes $2^n$ processing branches.

In some embodiments of any of the above apparatus, n=2.

In some embodiments of any of the above apparatus, the respective phase rotation has an angle selected from an angle set consisting of the following angles: $360m/2^n$ degrees, where m=0, 1, 2, . . . , $2^n-1$; and different processing branches are configured to use different respective angles from said angle set.

In some embodiments of any of the above apparatus, the first codeword has a length of at least 2n bits.

In some embodiments of any of the above apparatus, at least some of the $2^n$ processing branches include respective complex-number multipliers, each configured to apply the respective phase rotation by multiplying each of a plurality of complex numbers generated from the first set of digital values by a complex exponential factor having an argument that is proportional to an angle of the respective phase rotation.

In some embodiments of any of the above apparatus, the FEC code has a rate of ½ or lower.

In some embodiments of any of the above apparatus, the front-end circuit is configured to mix the modulated optical signal with an optical local-oscillator signal (e.g., 158, FIG. 1); and the respective measure of the phase is a measure of a phase mismatch between the optical carrier wave of the modulated optical signal and the optical local-oscillator signal.

In some embodiments of any of the above apparatus, each of the processing branches is further configured to identify a respective candidate codeword (e.g., output by signal 408$_m$, FIG. 4) based on a plurality of distance measures (e.g., squared distances $D^2_{k,i}$), each being a measure of a distance between the respective string of values and a respective one of a plurality of codewords of the FEC code. One of the candidate codewords identified by different processing branches is then selected by the receiver to be the receiver's best guess at the actually transmitted codeword.

In some embodiments of any of the above apparatus, the measure of the distance between the respective string of values and the respective one of the plurality of codewords of the FEC code is a squared Euclidean distance.

In some embodiments of any of the above apparatus, the digital circuit further comprises: a selector controller (e.g., 420, FIG. 4) configured to identify a processing branch having a smallest measure in the plurality of the measures of the phase; and a selector (e.g., 430, FIG. 4) configured to recover the first codeword by selecting the respective candidate codeword identified by the processing branch having said smallest measure.

In some embodiments of any of the above apparatus, each of the processing branches comprises: a respective maximum-likelihood detector (e.g., ML$_m$, FIG. 4) configured to identify the respective candidate codeword based on the plurality of distance measures by selecting a codeword in the plurality of codewords of the FEC code corresponding to a smallest of the plurality of the distance measures; and a respective sliding-window adder (e.g., SWA$_m$, FIG. 4) configured to generate the respective measure of the phase by summing $2L+1$ of the smallest distance measures, where L is a positive integer. One of said $2L+1$ smallest distance measures corresponds to the first set of digital values; a first L of said $2L+1$ smallest distance measures correspond to L sets of digital values generated by the front-end circuit based on a portion of the modulated optical signal corresponding to L codewords that precede the first codeword; and a second L of said $2L+1$ smallest distance measures correspond to L sets of digital values generated by the front-end circuit based on a portion of the modulated optical signal corresponding to L codewords that follow the first codeword.

In some embodiments of any of the above apparatus, each of the processing branches further comprises a respective delay line (e.g., buffer CWB$_m$, FIG. 4) configured to hold the respective candidate codeword for a period of time that enables the respective sliding-window adder to receive the second L of said $2L+1$ smallest distance measures from the respective maximum-likelihood detector.

In some embodiments of any of the above apparatus, the apparatus further comprises an optical transmitter (e.g., 110, FIG. 1) configured to generate the first codeword by including therein a set of information bits (e.g., ($b_k$, $b_{k+1}$, $b_{k+2}$, $b_{k+3}$)) and further including therein a set of parity bits (e.g., ($c_k$, $c_{k+1}$, $c_{k+2}$, $c_{k+3}$)) generated by applying an XOR operation to a plurality of subsets of the set of information bits.

In some embodiments of any of the above apparatus, the optical transmitter is further configured to cause the optical receiver to receive the modulated optical signal by modulating the optical carrier wave with a sequence of constellation symbols that encode the first codeword (e.g., in accordance with Eqs. (2a)-(2d)).

In some embodiments of any of the above apparatus, the optical transmitter is configured to generate said sequence of constellation symbols in a manner that causes a phase-rotated version of said sequence to encode a bit word that is not a codeword of the FEC code (e.g., as illustrated in FIGS. 3B-3D).

In some embodiments of any of the above apparatus, prior to applying the MLSE processing to the first set of digital values, the digital circuit is configured to preprocess the first set of digital values by performing one or more of the following: timing recovery for an FEC-encoded data frame carrying the first codeword; frame synchronization for said FEC-encoded data frame; electronic polarization rotation; electronic frequency estimation of a carrier frequency of the modulated optical signal; electronic compensation of a frequency offset between a carrier frequency of an optical local-oscillator signal and the carrier frequency of the modulated optical signal; electronic compensation of effects of polarization-mode dispersion in the modulated optical signal; electronic compensation of effects of chromatic dispersion in the modulated optical signal; and electronic channel equalization.

According to another example embodiment disclosed above in reference to FIGS. 1-4, provided is a method of estimating a phase of an optical carrier wave of a modulated optical signal, the method comprising the steps of: converting a portion of the modulated optical signal (e.g., 130', FIG. 1) corresponding to a first codeword (e.g., any of the codewords shown in Table 1, FIG. 2) of a forward error correction (FEC) code into a first set of digital values (e.g., carried by digital signals $168_1$ and $168_2$, FIGS. 1 and 4); and applying MLSE processing to the first set of digital values to estimate the phase of the optical carrier wave of the modulated optical signal. The step of applying comprises the sub-steps of: applying a different respective phase rotation to each of a plurality of copies of the first set of digital values to generate a plurality of strings of values (e.g., $V_k=(v_{1,k}, v_{2,k}, v_{3,k}, v_{4,k}, v_{5,k}, v_{6,k}, v_{7,k}, v_{8,k})$ in each processing branch of circuit 400, FIG. 4); generating a plurality of measures of the phase (e.g., sums $S_m$ of 2L+1 squared distances $(D^2_{k,i0})_m$ in each processing branch of circuit 400, FIG. 4) of the optical carrier wave based on the plurality of the strings of values and a plurality of codewords of the FEC code; selecting, based on a selection criterion, one of the plurality of the measures of the phase; and selecting a phase of the phase rotation corresponding to the selected one of the plurality of the measures of the phase as an estimate of the phase of the optical carrier wave.

In some embodiments of the above method, the selection criterion is to find in the plurality of the measures of the phase a measure that has a smallest value.

In some embodiments of any of the above methods, the modulated optical signal is modulated using a $2^n$-PSK constellation, where n is a positive integer; and the different respective phase rotations have phases selected from a phase set consisting of the following phases: $360m/2^n$ degrees, where m=0, 1, 2, ..., $2^n-1$.

In some embodiments of any of the above methods, the estimate of the phase has an accuracy that is better (i.e., the discrepancy is smaller) than $360/2^n$ degrees.

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

A person of ordinary skill in the art would readily recognize that steps of various above-described methods can be performed by programmed computers. Herein, some embodiments are intended to cover program storage devices, e.g., digital data storage media, which are machine or computer readable and encode machine-executable or computer-executable programs of instructions where said instructions perform some or all of the steps of methods described herein. The program storage devices may be, e.g., digital memories, magnetic storage media such as magnetic disks or tapes, hard drives, or optically readable digital data storage media. The embodiments are also intended to cover computers programmed to perform said steps of methods described herein.

The description and drawings merely illustrate the principles of the invention. It will thus be appreciated that those of ordinary skill in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The functions of the various elements shown in the figures, including any functional blocks labeled as "processors," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

What is claimed is:

1. An apparatus comprising an optical receiver that comprises:
   a front-end circuit configured to convert a portion of a modulated optical signal corresponding to a first codeword of a forward error correction (FEC) code into a first set of digital values; and
   a digital circuit configured to apply maximum likelihood sequence estimation (MLSE) processing to the first set of digital values, wherein the digital circuit comprises a plurality of parallel processing branches, each configured to:
      receive a copy of the first set of digital values;
      apply a respective phase rotation to said copy to generate a respective string of values; and
      generate, based on the respective string of values, a respective measure of a phase of an optical carrier wave of the modulated optical signal; and
   wherein the digital circuit is configured to recover the first codeword based on the plurality of said measures of the phase generated by said plurality of parallel processing branches.

2. The apparatus of claim 1, wherein the modulated optical signal is modulated using a QAM constellation.

3. The apparatus of claim 1, wherein:
   the modulated optical signal is modulated using a $2^n$-PSK constellation, where n is a positive integer; and
   the plurality of parallel processing branches includes $2^n$ processing branches.

4. The apparatus of claim 3, wherein n=2.

5. The apparatus of claim 3, wherein:
   the respective phase rotation is by an angle selected from an angle set consisting of the following angles: $360m/2^n$ degrees, where m=0, 1, 2, ..., $2^n-1$; and
   different processing branches are configured to use different respective angles from said angle set.

6. The apparatus of claim 3, wherein the first codeword has a length of at least 2n bits.

7. The apparatus of claim 3, wherein at least some of the $2^n$ processing branches include respective complex-number multipliers, each configured to apply the respective phase rotation by multiplying each of a plurality of complex numbers generated from the first set of digital values by a complex exponential factor having an argument that is proportional to an angle of the respective phase rotation.

8. The apparatus of claim 1, wherein the FEC code has a rate of ½ or lower.

9. The apparatus of claim 1, wherein:
   the front-end circuit is configured to mix the modulated optical signal with an optical local-oscillator signal; and
   the respective measure of the phase is a measure of a phase mismatch between the optical carrier wave of the modulated optical signal and the optical local-oscillator signal.

10. The apparatus of claim 1, wherein each of the processing branches is further configured to identify a respective candidate codeword based on a plurality of distance measures, each being a measure of a distance between the respective string of values and a respective one of a plurality of codewords of the FEC code.

11. The apparatus of claim 10, wherein the measure of the distance between the respective string of values and the respective one of the plurality of codewords of the FEC code is a squared Euclidean distance.

12. The apparatus of claim 10, wherein the digital circuit further comprises:
    a selector controller configured to identify a processing branch having a smallest measure in the plurality of the measures of the phase; and
    a selector configured to recover the first codeword by selecting the respective candidate codeword identified by the processing branch having said smallest measure.

13. The apparatus of claim 10, wherein each of the parallel processing branches comprises:
    a respective maximum-likelihood detector configured to identify the respective candidate codeword based on the plurality of the distance measures by selecting a codeword, in the plurality of codewords of the FEC code, corresponding to a smallest of the plurality of the distance measures; and
    a respective sliding-window adder configured to generate the respective measure of the phase by summing 2L+1 of the smallest distance measures, where L is a positive integer, wherein:
       one of said 2L+1 smallest distance measures corresponds to the first set of digital values;
       a first L of said 2L+1 smallest distance measures correspond to L sets of digital values generated by the front-end circuit based on a portion of the modulated optical signal corresponding to L codewords that precede the first codeword; and
       a second L of said 2L+1 smallest distance measures correspond to L sets of digital values generated by the front-end circuit based on a portion of the modulated optical signal corresponding to L codewords that follow the first codeword.

14. The apparatus of claim 13, wherein each of the parallel processing branches further comprises a respective delay line configured to hold the respective candidate codeword for a period of time that enables the respective sliding-window adder to receive the second L of said 2L+1 smallest distance measures from the respective maximum-likelihood detector.

15. The apparatus of claim 1, further comprising an optical transmitter configured to generate the first codeword by including therein a set of information bits and further including therein a set of parity bits corresponding to the set of information bits.

16. The apparatus of claim 15, wherein the optical transmitter is further configured to cause the optical receiver to receive the modulated optical signal by modulating the optical carrier wave with a sequence of constellation symbols that encode the first codeword.

17. The apparatus of claim 16, wherein the optical transmitter is configured to generate said sequence of constellation symbols in a manner that causes a phase-rotated version of said sequence to encode a bit word that is not a codeword of the FEC code.

* * * * *